(12) United States Patent
Sengupta et al.

(10) Patent No.: US 12,141,686 B2
(45) Date of Patent: Nov. 12, 2024

(54) SPIN ORBIT TORQUE BASED ELECTRONIC NEURON

(71) Applicant: Purdue Research Foundation, West Lafayette, IN (US)

(72) Inventors: Abhronil Sengupta, West Lafayette, IN (US); Sri Harsha Choday, San Diego, CA (US); Yusung Kim, West Lafayette, IN (US); Kaushik Roy, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 1008 days.

(21) Appl. No.: 16/999,049

(22) Filed: Aug. 20, 2020

(65) Prior Publication Data

US 2021/0142157 A1 May 13, 2021

Related U.S. Application Data

(63) Continuation of application No. 15/445,906, filed on Feb. 28, 2017, now abandoned.
(Continued)

(51) Int. Cl.
*H01L 43/08* (2006.01)
*G06F 7/58* (2006.01)
(Continued)

(52) U.S. Cl.
CPC ............. *G06N 3/065* (2023.01); *G06F 7/588* (2013.01); *G06N 3/04* (2013.01); *H10B 63/20* (2023.02);
(Continued)

(58) Field of Classification Search
CPC .......... G06N 3/04; G06N 3/084; H10B 63/20; H10B 61/00–22; H10N 50/10; H10N 52/00; H10N 50/80; H10N 50/85; H10N 50/01; G11C 11/54; G11C 11/161; G11C 2211/5615; G11C 2213/15; G06F 2207/4824; G06F 7/48; G01R 33/098; G11B 5/3909
See application file for complete search history.

(56) References Cited

U.S. PATENT DOCUMENTS

2013/0234088 A1* 9/2013 Nishi ................... H10N 70/011
257/1
2014/0056061 A1* 2/2014 Khvalkovskiy ....... H01F 41/325
365/158

(Continued)

*Primary Examiner* — Shahed Ahmed
(74) *Attorney, Agent, or Firm* — Purdue Research Foundation

(57) ABSTRACT

An electronic neuron device that includes a thresholding unit which utilizes current-induced spin-orbit torque (SOT). A two-step switching scheme is implemented with the device. In the first step, a charge current through heavy metal (HM) places the magnetization of a nano-magnet along the hard-axis (i.e. an unstable point for the magnet). In the second step, the device receives a current (from an electronic synapse) which moves the magnetization from the unstable point to one of the two stable states. The polarity of the net synaptic current determines the final orientation of the magnetization. A resistive crossbar array may also be provided which functions as the synapse generating a bipolar current that is a weighted sum of the inputs of the device.

7 Claims, 15 Drawing Sheets

Related U.S. Application Data

(60) Provisional application No. 62/300,852, filed on Feb. 28, 2016.

(51) Int. Cl.
*G06N 3/04* (2023.01)
*G06N 3/065* (2023.01)
*H10B 63/00* (2023.01)
*H10N 50/10* (2023.01)
*H10N 52/00* (2023.01)
G11C 11/54 (2006.01)
H10B 61/00 (2023.01)

(52) U.S. Cl.
CPC ............. *H10N 50/10* (2023.02); *H10N 52/00* (2023.02); *G11C 11/54* (2013.01); *H10B 61/22* (2023.02)

(56) References Cited

U.S. PATENT DOCUMENTS

| | | | |
|---|---|---|---|
| 2017/0178705 A1* | 6/2017 | Buhrman | ............. G11C 11/161 |
| 2018/0203261 A1* | 7/2018 | Hosseini | ............... G02F 1/0311 |

* cited by examiner

SPIN ORBIT TORQUE BASED ELECTRONIC NEURON

CROSS-REFERENCE TO RELATED APPLICATIONS

The present patent application is a continuation of U.S. patent application Ser. No. 15/445,906, filed Feb. 28, 2017, which is related to and claims the priority benefit of U.S. Provisional Patent Application Ser. No. 62/300,852, filed Feb. 28, 2016, the contents of which is hereby incorporated by reference in its entirety into the present disclosure.

TECHNICAL FIELD

The present application relates to artificial neural networks, and more specifically, to a spin orbit torque based electronic neuron.

BACKGROUND

Artificial neural networks (ANNs) attempt to replicate the remarkable efficiency of the biological brain for performing cognitive tasks such as learning, pattern recognition and classification. At the heart of any ANN is an artificial neuron whose transfer function mimics that of a biological neuron. One of the most widely used models of an artificial neuron with an output (y) and a transfer function ($f$) can be written as $y=f(\Sigma_i w_i x_i + b)$ where, $x_i$ is an input to the neuron, $w_i$ is its corresponding synaptic weight, and b is a constant bias term. Thus, the two main computational units of the artificial neuron are weighted summation of inputs followed by a thresholding operation. Traditionally, ANNs have been implemented in software running on a Von-Neumann type general-purpose computer. The implementation of large scale ANNs on general purpose computers requires significant computational capability and consumes energy that is orders of magnitude larger than its biological counterpart. Recent developments in the field of neuromorphic computation attempt to bridge this gap by emulating artificial neurons using custom analog/digital CMOS circuits. However, the emulation of artificial neurons using CMOS circuits remains highly inefficient in terms of energy consumption and silicon area. The inefficiency in CMOS based ANNs arises due to the significant mismatch between the functionality of a biological neuron and the CMOS devices which are better suited for Boolean logic. Therefore, improvements are needed in the field.

SUMMARY

The present disclosure provides an electronic neuron device that includes a thresholding unit which utilizes current-induced spin-orbit torque (SOT). A two-step switching scheme is implemented with the device. In the first step, a charge current through heavy metal (HM) places the magnetization of a nano-magnet along the hard-axis (i.e. an unstable point for the magnet). In the second step, the device receives a current (from an electronic synapse) which moves the magnetization from the unstable point to one of the two stable states. The polarity of the net synaptic current determines the final orientation of the magnetization. A resistive crossbar array may also be provided which functions as the synapse generating a bipolar current that is a weighted sum of the inputs of the device.

BRIEF DESCRIPTION OF THE DRAWINGS

In the following description and drawings, identical reference numerals have been used, where possible, to designate identical features that are common to the drawings.

FIG. 9b illustrates a memory array incorporating a plurality of the bit cells of FIG. 9a.

FIG. 9c illustrates a timing diagram for the device of FIG. 9a.

FIG. 9d illustrates a simulated waveform of free layer magnetization for the device of FIG. 9a.

The attached drawings are for purposes of illustration and are not necessarily to scale.

DETAILED DESCRIPTION

In the following description, some aspects will be described in terms that would ordinarily be implemented as software programs. Those skilled in the art will readily recognize that the equivalent of such software can also be constructed in hardware, firmware, or micro-code. Because data-manipulation algorithms and systems are well known, the present description will be directed in particular to algorithms and systems forming part of, or cooperating more directly with, systems and methods described herein. Other aspects of such algorithms and systems, and hardware or software for producing and otherwise processing the signals involved therewith, not specifically shown or described herein, are selected from such systems, algorithms, components, and elements known in the art. Given the systems and methods as described herein, software not specifically shown, suggested, or described herein that is useful for implementation of any aspect is conventional and within the ordinary skill in such arts.

Figure 1A:
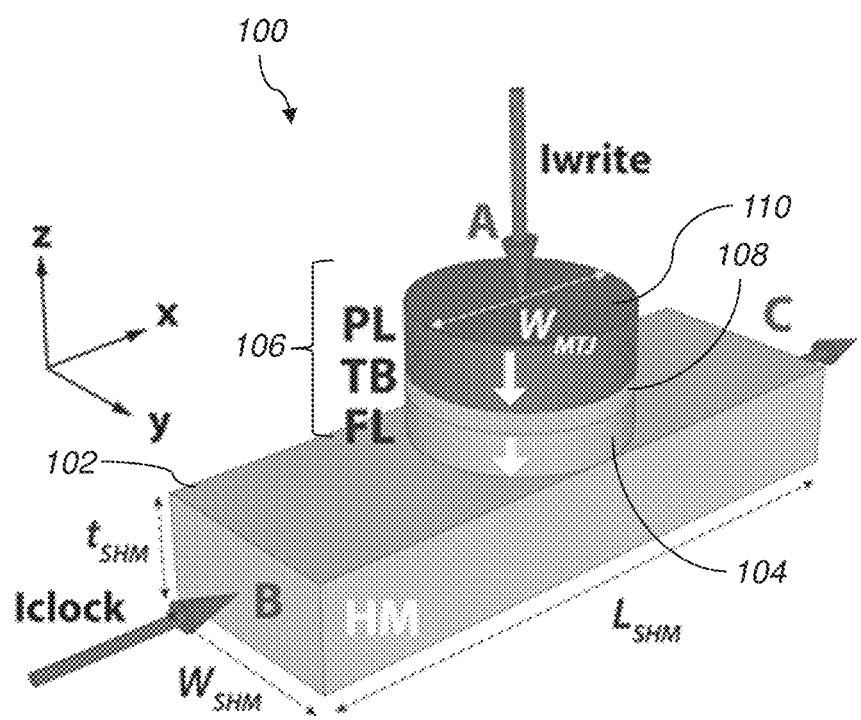
FIG. 1a is a diagram illustrating a spin-orbit torque based electronic neuron according to various aspects.
Figure 2:
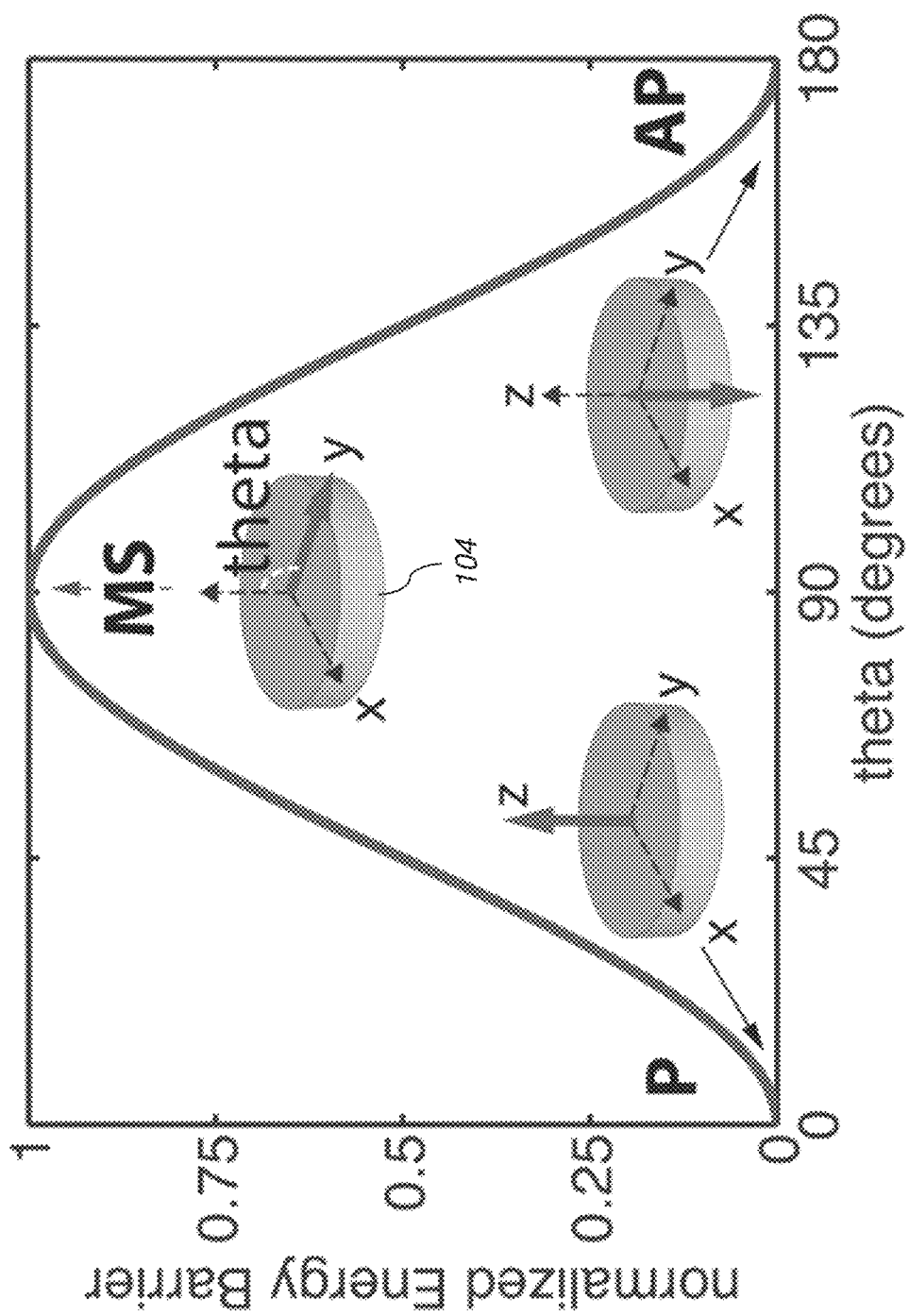
FIG. 2 is a plot showing the normalized energy landscape of a with uniaxial anisotrphy in the out-of-plane direction according to various aspects.

FIG. 1a shows a thresholding unit 100 for an electronic neuron according to various aspects. The thresholding device 100 comprises a heavy metal layer 102 having high spin-orbit coupling, and a perpendicular magnetic anisotrophy (PMA) free layer (FL) 104 in contact with the top surface of the heavy metal layer 102. The free layer 104 may have uniaxial anisotropy, which may be achieved based on the free layer 104 shape, interface, or bulk magneto-crystalline anisotropy. FIG. 2 illustrates a sample energy landscape of the free layer 104, wherein two energy minima points (stable magnetization points) are separated by an anisotropy barrier. In addition, the free layer 104 is part of a magnetic tunnel junction (MTJ) 106 comprising the free layer 104, an oxide tunnel barrier (TB) 108 and a PMA pinned layer (PL) 110. In certain embodiments, the MTJ 106 is cylindrical in shape as shown.

In the HM layer 102, when the spin Hall effect (SHE) is the dominant underlying physical mechanism in play, a flow of charge current through the HM layer 102 generates pure spin current in the direction transverse to the charge current due to preferential scattering of different spins to different directions. This pure spin current is then used to control the free layer 104 on top, via the spin-transfer torque effect.

In certain embodiments, the HM layer 102 may comprise beta-Tantalum, Tungsten, or Platinum. The free layer 104 and pinned layer 110 may comprise any ferromagnetic material including, but not limited to, CoFe or CoFeB. The oxide tunnel barrier 108 may comprise an oxide material such as MgO.

Figure 1B:
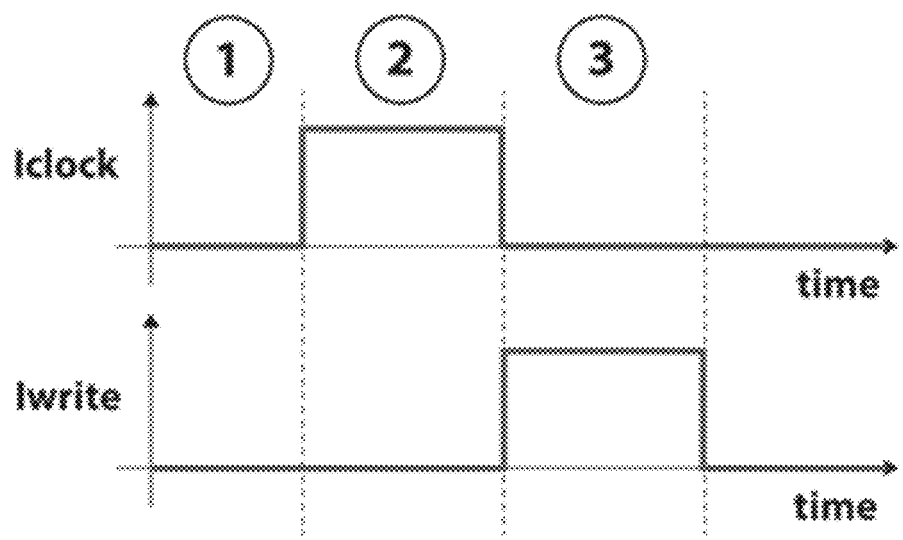
FIG. 1b is a diagram illustrating a switching scheme for the electronic of FIG. 1a according to various aspects.

According to certain aspects, a two-step switching scheme is applied to the thresholding device 100. The two-step switching scheme a) minimizes the required current from the electronic synapse, and b) utilizes the spin hall effect for an energy efficient thresholding operation. As shown in FIG. 1b, for the first step, a charge current ($I_{Clock}$) is supplied through the HM layer 102 (between terminals B and C of FIG. 1a) which generates a torque to align the free layer 104 magnetization in the ±y direction as shown in FIG. 1a. In other words, $I_{Clock}$ aligns the free layer 104 magnetization along the hard-axis of the magnet, i.e. the unstable point in the energy landscape (labelled as MS in FIG. 2). Let us define this switching stage as "hard-axis switching". Subsequently in the second step, electronic synapses (not shown) connected to the thresholding device 100 drive a charge current ($I_{write}$, FIG. 1b) between terminals A and C of the device 100 (as shown in FIG. 1a). In the illustrated embodiment, temporal overlap between the two pulses has been neglected but the second pulse is applied after the first pulse with negligible delay. However, it shall be understood that the pulses may overlap in certain embodiments. The net synaptic current ($I_{write}$) flowing through the MTJ 106 exerts a torque on the magnetization which will align the magnet (free layer 104) to either one of the easy axis directions along the ±z axis (as shown in FIG. 1a). This step is referred to as "easy-axis switching". The direction of torque generated by $I_{write}$ depends on the polarity of the applied net synaptic current. If the synaptic current is a positive value, the sign of the torque is such that the free layer 104 magnetization becomes anti-parallel (AP) to the magnetization of the pinned layer 110. On the other hand, a negative synaptic current places the free layer 104 magnetization parallel (P) to that of the pinned layer 110. The P and AP states of the MTJ 106 correspond to the low and high (binary) outputs of the neuron made up of the MTJ 106. The proposed thresholding device therefore mimics the operation of a biological neuron 'firing' a pulse when the synaptic signal exceeds a certain threshold.

The direction and the magnitude of spin current and its spin polarization in the SHE can be determined from the relationship, $J_s=\theta_{SH}(\sigma \times J_q)$ where $J_S$ and $J_q$ are the transverse spin current and charge current, respectively, $\theta_{SH}$ is a material-dependent spin Hall angle, and $\sigma$ is the polarization of the spin current. Magnetization dynamics of the free layer 104 are obtained by solving Landau-Lifshitz-Gilbert equation with additional term to account for the torque due to transverse spin current per equation (1) below:

$$\frac{d\hat{m}}{dt} = -\gamma(\hat{m} \times H_{\mathit{eff}}) + \alpha\left(\hat{m} \times \frac{d\hat{m}}{dt}\right) + \frac{1}{qN_s}(\hat{m} \times I_s \times \hat{m}) \quad (1)$$

where $\hat{m}$ is the unit vector of free layer magnetization, $\gamma=2\mu_s\mu_0/\hbar$ is the gyromagnetic ratio for electron [rad·m/(A·s)], $H_{\mathit{eff}}$ is the effective magnetic field [A/m], and $I_S=\theta_{SH}(A_{MTJ}/A_{HM})I_q\hat{\sigma}$ is the spin current injected into the free-layer [A]. $N_s$ is the number of spins in the free layer defined as $M_S V/\mu_B$ where $M_S$ is saturation magnetization [A/m], V the volume of the free layer (m³), and $\mu_B$ the Bohr magneton (A·m2). The effective field $H_{\mathit{eff}}$ includes shape anisotropy field $H_{shape}=-(N_{XX}, N_{YY}, N_{ZZ})M_S$ the demagnetization factors, $N_{XX}$, $N_{YY}$, $N_{ZZ}$ for elliptical disks, magnetocrystalline anisotropy $H_{Ku2}$ perpendicular to the free layer 104 plane direction, external magnetic field $H_a$, and thermal fluctuation field $H_{thermal}$ given by $$H_{i,thermal}(t) = \sqrt{\frac{\alpha}{1+\alpha^2} \frac{2k_B T}{\gamma\mu_0 M_s V \delta_t}} \, G_{0,1}$$

where, $G_{0,1}$ is a Gaussian distribution with zero mean and unit standard deviation, $k_B$ the Boltzmann constant, T is the temperature, $\delta_t$ the simulation time-step, chosen as 0.1 ps in this example.

Figure 3:
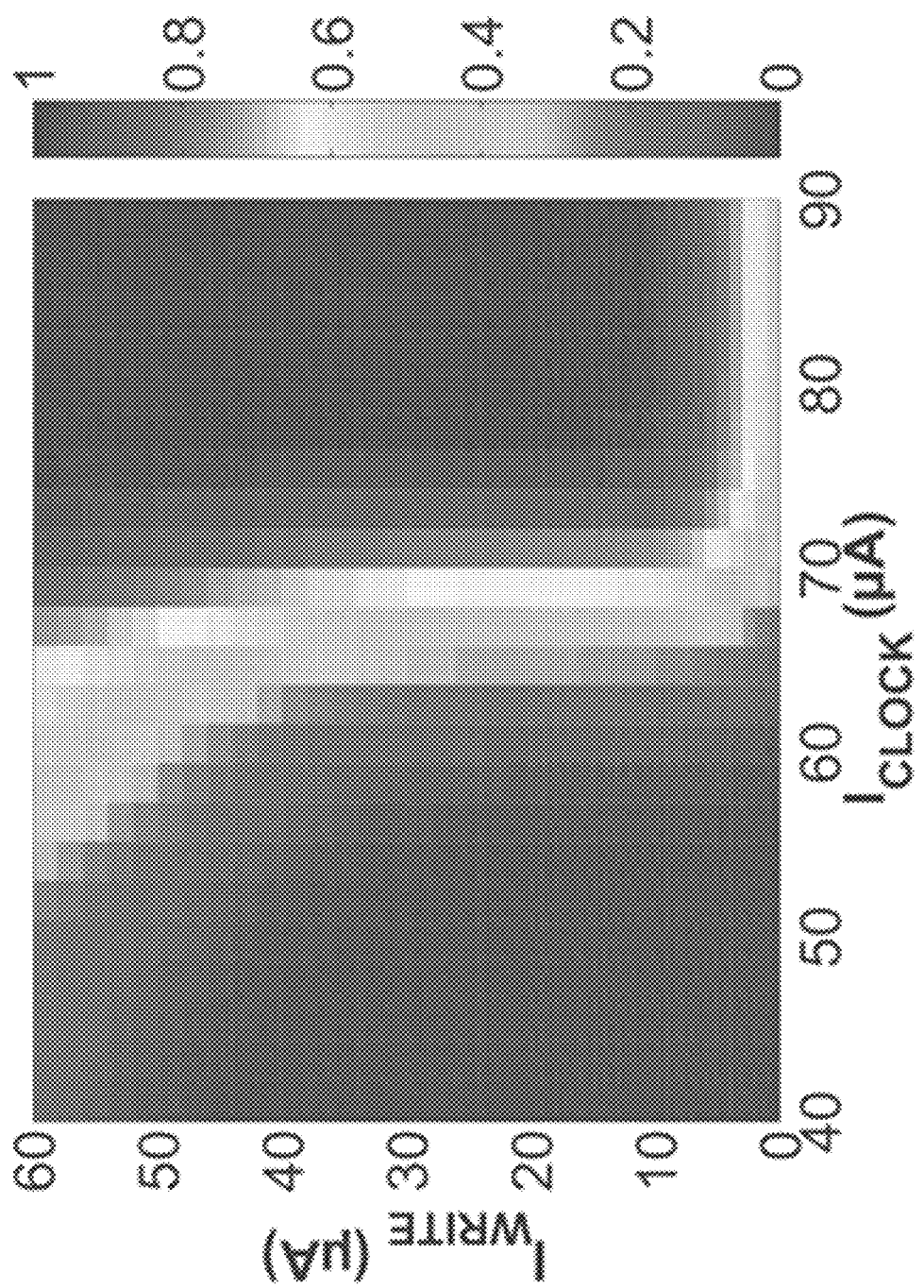
FIG. 3 is a switching phase diagram showing probability of switching for a range of clock and write currents for the device of FIG. 1 according to various aspects.

To determine the appropriate magnitude of clock and write currents for the device 100, a switching phase diagram for a range of clock and write currents is constructed as shown in FIG. 3. For each set of clock and write currents, ~100,000 stochastic LLG simulations were carried out to obtain the statistics of switching. For simplicity, the rise and fall times of the pulses were set to zero and the pulse width for clock and write currents were set to 2 ns and 1 ns, respectively. As it can be observed from FIG. 3, when clock current is large enough, the amount of write current needed to achieve successful switching is on the order of few µA, just enough to overcome thermal fluctuations and tilt the magnet in the desired direction. Although some amount of the synaptic current flows through the heavy metal layer 102, the spin-orbit torque generated due to this minimal current is expected to have negligible impact on the magnetization of the free layer 104. Thus the device 100 facilitates fast and energy-efficient threshold operation by utilizing Spin-Hall effect for "hard-axis switching" and minimal synaptic current for deterministic "easy-axis switching".

Figure 4:
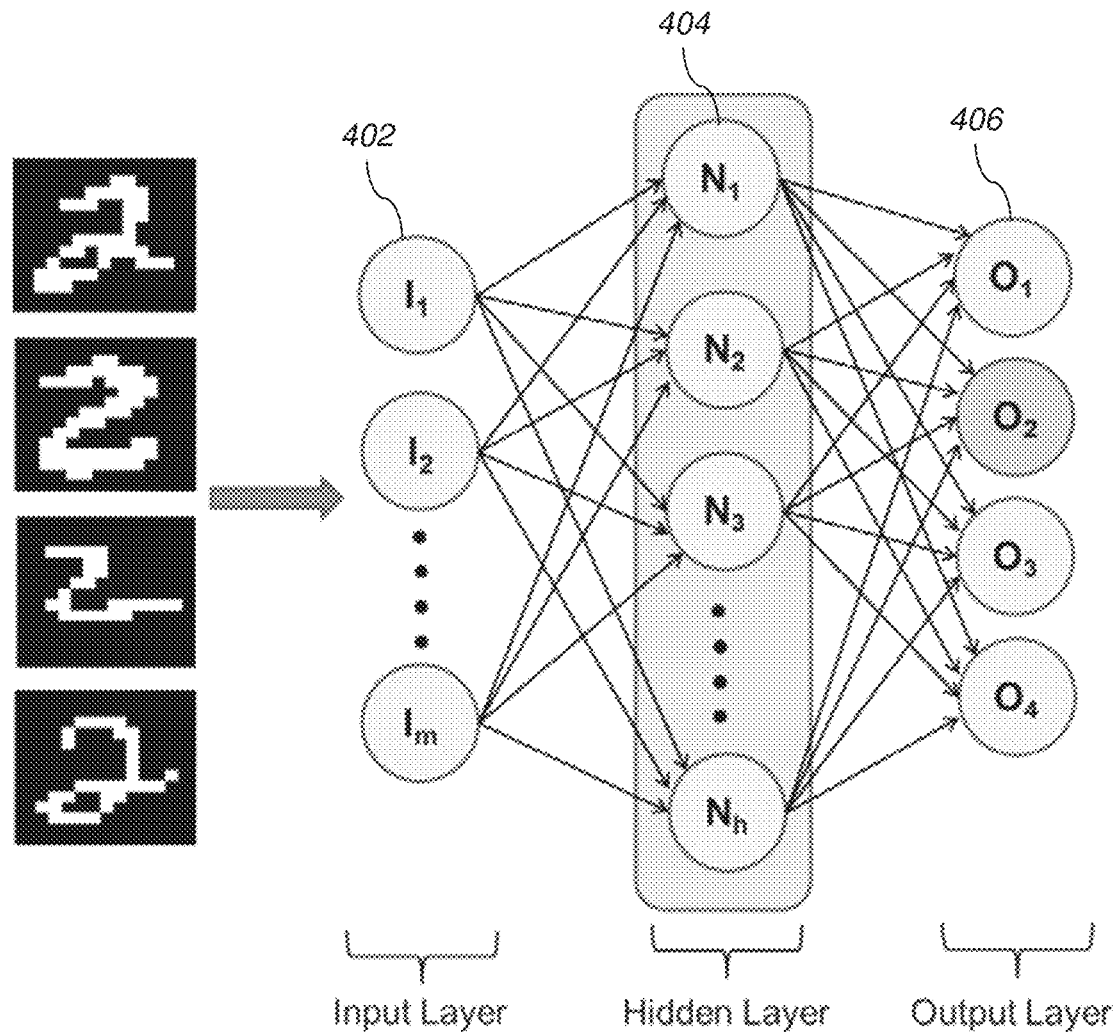
FIG. 4 is a diagram illustrating a neural network configuration with m number of inputs and h number of hidden layer neurons used for digit (0-3) recognition according to various aspects.
Figure 5:
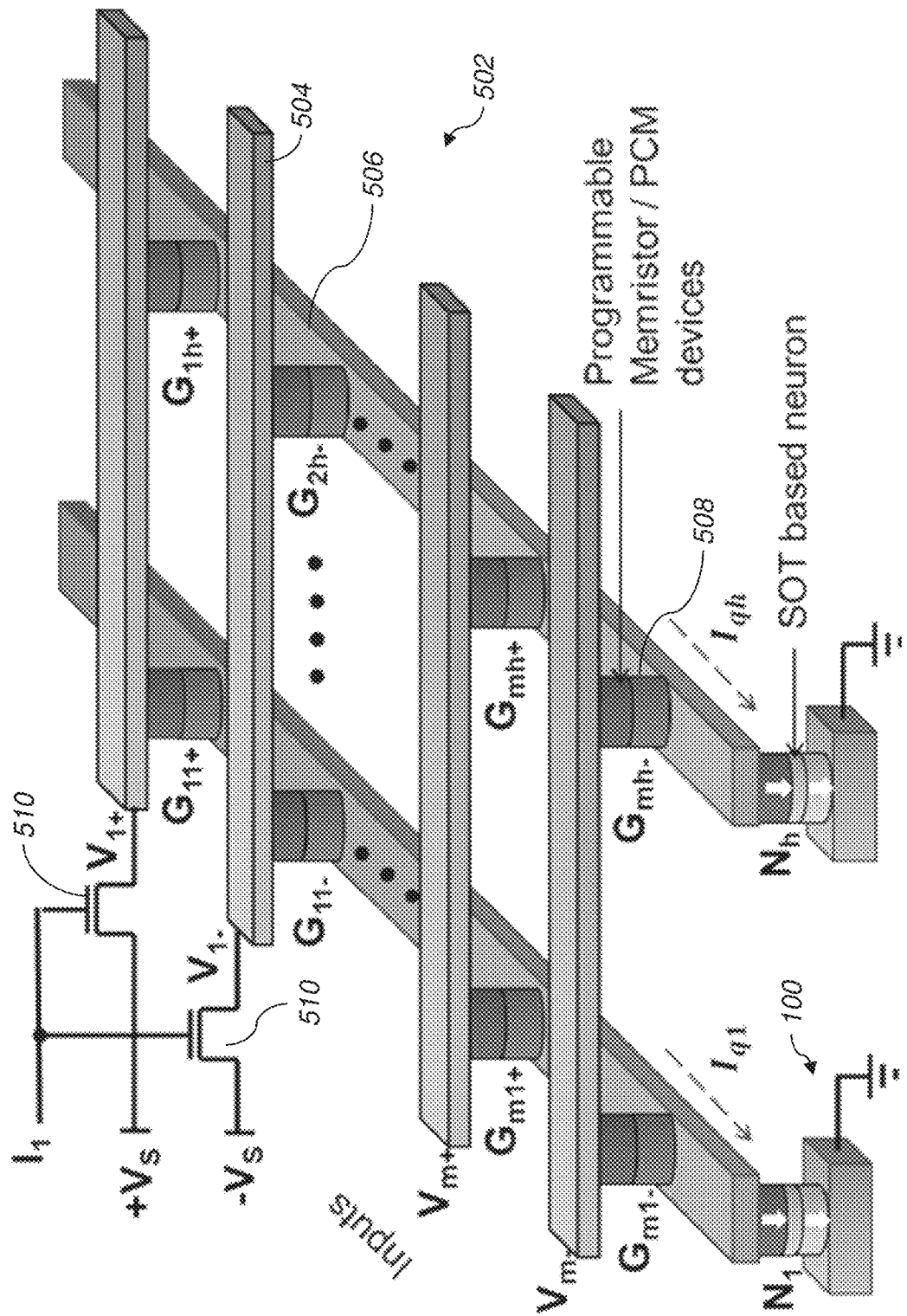
FIG. 5 is a diagram illustrating a resistive crossbar network (RCN) for computation of weighted summation of electronic neuron inputs according to various aspects.

According to one embodiment, an arrangement of a neural network 400 with m number of inputs 402, h number of hidden layer neurons 404, and outputs 406 according to one embodiment is shown in FIG. 4. Consider a hardware mapping for the hidden layer of the neural network 400 as shown in FIG. 5. The hidden layer can be represented by a resistive crossbar network (RCN) 502 having a plurality of resistive memory elements 508, where each row crossbar 504 provides the corresponding input to all the neurons in that layer while each column crossbar 506 provides the net synaptic current to the spin neurons made up of MTJs 106 of thresholding devices 100. The row and column crossbars comprise a conductive material, such as copper, gold, aluminum, or the like. The resistive memory elements may comprise, but are not limited to, Phase Change memories (e.g., GeSbTe memristors), Ag—Si memristors or even spintronic devices.

Figure 1C:
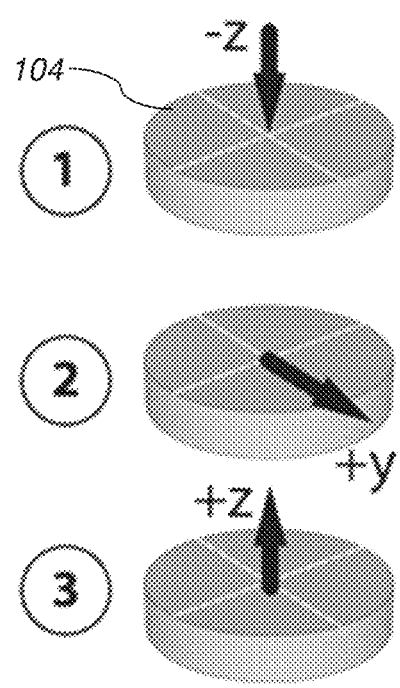
FIG. 1c is a diagram illustrating orientation of a ferromagnet along a hard-axis of the electronic neuron of FIG. 1a as the switching scheme of FIG. 1b is executed according to various aspects.

In order to implement bipolar weights, two row crossbars 504 are used for each input I as shown in FIG. 5 (with each input I in FIG. 5 corresponding to an input 402 in FIG. 4). Each input I drives the gates of the two pass transistors 510, one of whose switched terminals are connected to the RCN 502 while the other switched terminal is connected to a positive ($+V_S$) and negative ($-V_S$) supply respectively as shown. For efficient operation of the RCN 502, the input switches should have a very low ON resistance to minimize the voltage drop across them. If the weight for a particular input is positive, then the conductance corresponding to $+V_S$ is programmed to the corresponding weight, while the conductance corresponding to $-V_S$ is programmed to a very high OFF resistive state and vice versa. Each column 506 of the RCN 502 is connected to the pinned layer 110 of the MTJ 106 (which forms the neuron) of the device 100, such that the device 100 receives the resultant synaptic current from the RCN 502 (with the synaptic current path flowing from the pinned layer 106, through the MTJ 106, and out to terminal C of FIG. 1 as discussed above). Considering the conductance in the path of the net synaptic current while flowing through the spin-neuron (device 100) to be $GG_{ss}$, the charge current received by the j-th neuron is given by $I_{qj}=$ $$G_s \cdot \sum_{i=1}^{m}(G_{ij+} \cdot V_{i+} + G_{ij-} \cdot V_{i-}) / \left(G_s + \sum_{i=1}^{m}(G_{ij+} + G_{ij-})\right) \propto$$
$$\sum_{i=1}^{m}(G_{ij+} \cdot V_{i+} + G_{ij-} \cdot V_{i-}).$$

Therefore, the charge current $II_{qqqq}$ is proportional to the weighted summation of the inputs ($W_{ii}$) and the synaptic weights ($GG_{iiqq}$). The sign of the charge current determines the direction of the resultant spin current and hence the final state of the nano-magnet in the device 100.

Figure 6:
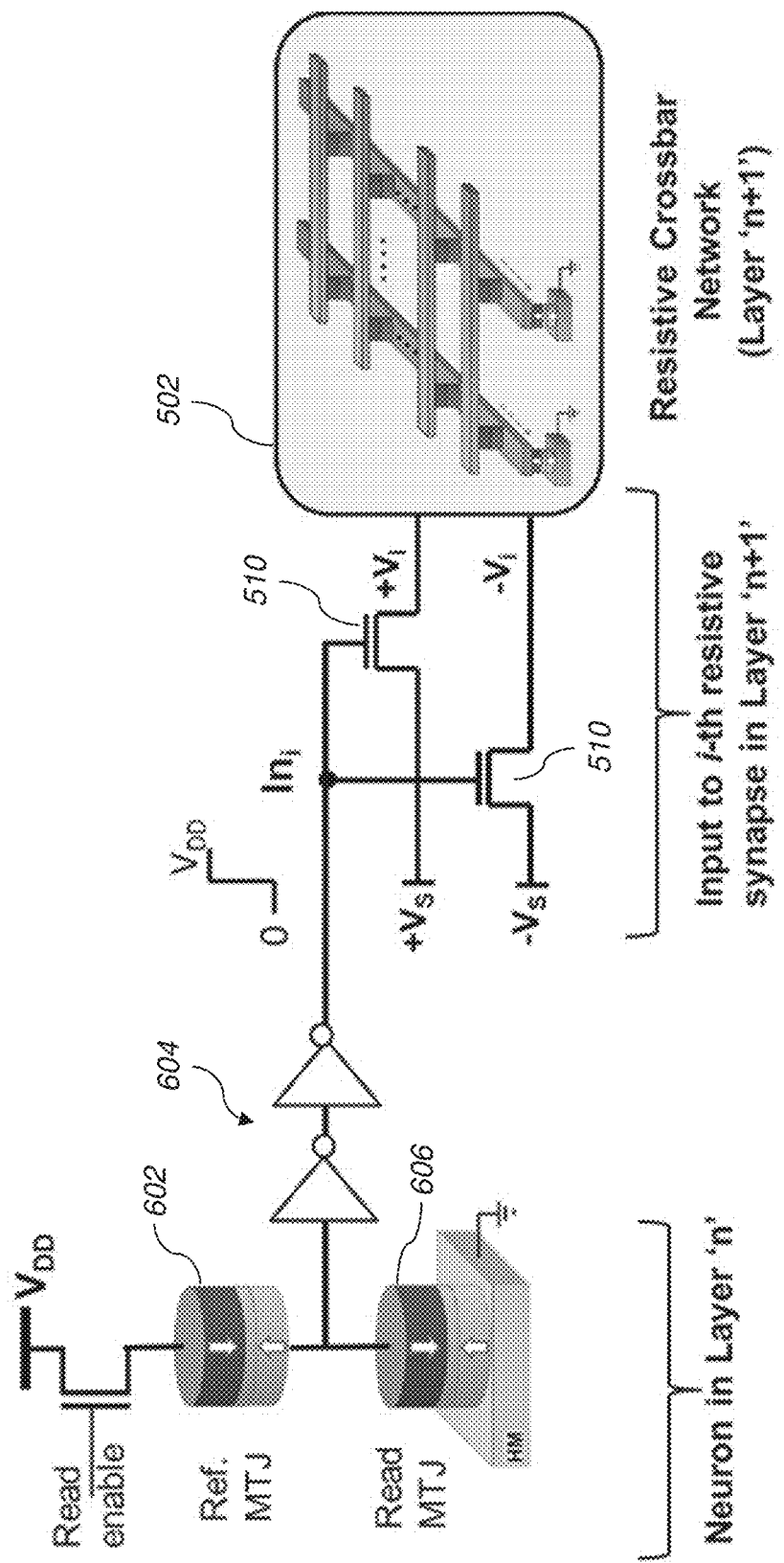
FIG. 6 is a schematic diagram illustrating a Read circuit for electronic neuron state according to various aspects.

According to one embodiment, interlayer communication is performed using a read circuit as shown in FIG. 6. A reference MTJ 602 in the AP state is utilized to form a resistive divider network which drives an inverter 604. For a positive charge current input to the neuron, the MTJ 606 in the SOT-based neuron is switched to the AP state. Thus the output voltage after the inverter stage 604 switches to $V_{DD}$ which drives the gates of the two input pass transistors 510 of the RCN 502 in the succeeding stage.

In one test example, the neural network was designed to recognize the first 4 digits from the MNIST machine learning dataset. The images were downscaled to size 8×8 and 100 images were utilized for evaluating the performance of the network. The network consisted of 25 hidden layer neurons and 4 output layer neurons. The presently disclosed neuromorphic architecture falls into the category of hardware that utilizes off-chip learning. The weights and biases obtained from offline training of the network using back-propagation algorithm were mapped to conductance values of a resistive crossbar network similar to RCN 502. The mapping was done assuming a 5 bit discretization in the resistance levels of the crossbar network and a dynamic range (ratio of highest to lowest resistance in the array) of 20. Input currents obtained from SPICE simulations of the RCN 502 were then used to solve stochastic magnetization dynamics for the SOT based neuron. For the first stage of the switching process, a charge current of ~85 µA (from FIG. 3) was used to orient the nano-magnet in the hard-axis position within a duration of 2 ns, resulting in a power consumption of ~7.22 µW per neuron. The fast and energy efficient "hard-axis switching" is mainly attributed to a spin injection efficiency of 4.71 resulting from SOT. In the next step, the net synaptic charge current from the RCN 502 drives the magnet to one of its stable magnetization states. The operating supply voltages of the RCN were limited by the minimum current required to deterministically switch the spin neuron in the appropriate direction (FIG. 3). For this work, the supply voltages were maintained at ±1 V and the network accuracy was determined by running 100 stochastic simulations of the network for each input image from the total set of 100 images of the dataset. This was performed utilizing the switching probability curve obtained from FIG. 3 to capture the effect of the magnet's non-deterministic switching on the accuracy of the network. The accuracy of the network over the set of 10,000 simulation runs was ~80% with reference to an accuracy of ~87% without thermal fluctuations. Simulation of the read circuit for the neuron state was performed using the NEGF based transport simulation framework proposed in. The average power consumption per neuron obtained from SPICE simulations of the neural network was ~351.94 µW.

TABLE I

Simulation Parameters for SOT-based neuron

| Parameters | Value |
|---|---|
| Free layer volume | |
| Free layer volume | $\frac{\pi}{4} \times 40 \times 40 \times 1.5$ nm |
| Saturation Magnetization | 1000 kA/m |
| Spin Hall angle | 0.3 |
| Spin Hall metal dimension | 40 × 40 × 2 nm³ |
| Spin Hall metal resistivity | 200 µΩ-cm |
| Gilbert Damping Factor | 0.0122 |
| Energy Barrier | 31.44 KT |
| MgO Thickness | 1.0 nm |
| Programming range of RCN | 8-160 KΩ |
| No. of programming levels in RCN | 32 |
| RCN operating voltage | 1 V |

In order to perform an iso-throughput comparison with digital CMOS technology, a neural network hardware was synthesized using a standard cell library in 45 nm commercial CMOS technology. A 5-bit precision was used for the weights and each neuron was pipelined after every stage of multiplication and addition. The average power consumption per neuron was ~1.06 mW.

Figure 7:
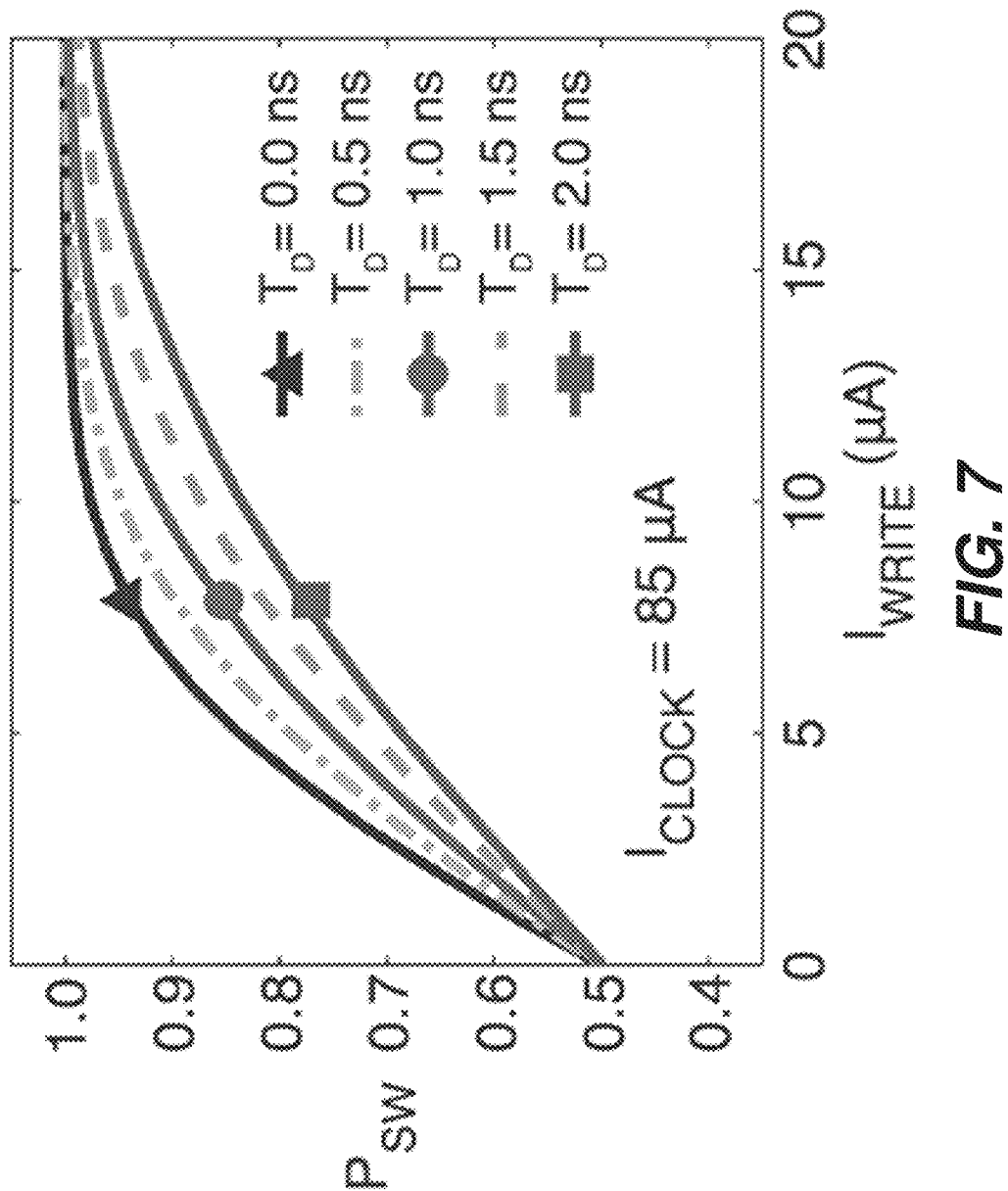
FIG. 7 is a plot showing the variation of the probability of switching of the FL with the synaptic current, corresponding to a clocking current of 85 µA for different values of delay (TD) between the clocking and synaptic currents according to various aspects.

In order to assess the functionality of the presently disclosed device due to the presence of a finite delay between the $I_{Clock}$ and $I_{Write}$ signals, we determine the variation of the probability of switching $P_{SW}$ of the free layer 104 with the synaptic current, corresponding to a clocking current of 85 µA (FIG. 7). Once the magnetization is put in its "hard-axis", its relaxation to "easy-axis" can be described by a characteristic relaxation time constant, $$\tau_D = \frac{1+\alpha^2}{\alpha\gamma H_K},$$

where $H_K$ is effective anisotropy field. Using simulation parameters used above, the relaxation time constant $\tau_v$ is calculated as 3.5 ns. As a result, if the delay time between $I_{Clock}$ and $I_{Write}$ is less than $\tau_v$, then the functionality of the proposed neuron would not be significantly affected. A worst case simulation of the feed-forward ANN with an average delay of 1 ns between the clocking and synaptic currents for each neuron in the network show a degradation in classification accuracy by ~5% only. The inherent error resiliency of such neural computing algorithms helps in nullifying the effect of delay between clocking and synaptic currents to a large extent.

Figure 8A:
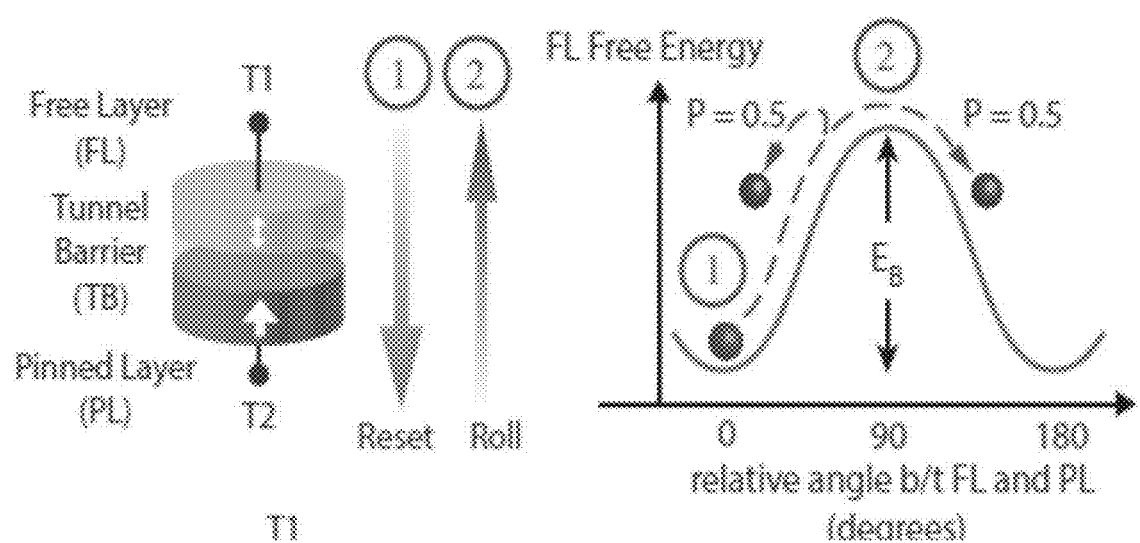
FIG. 8a illustrates a random number generator implementation in a first state using the device of FIG. 1 according to various aspects.
Figure 8B:
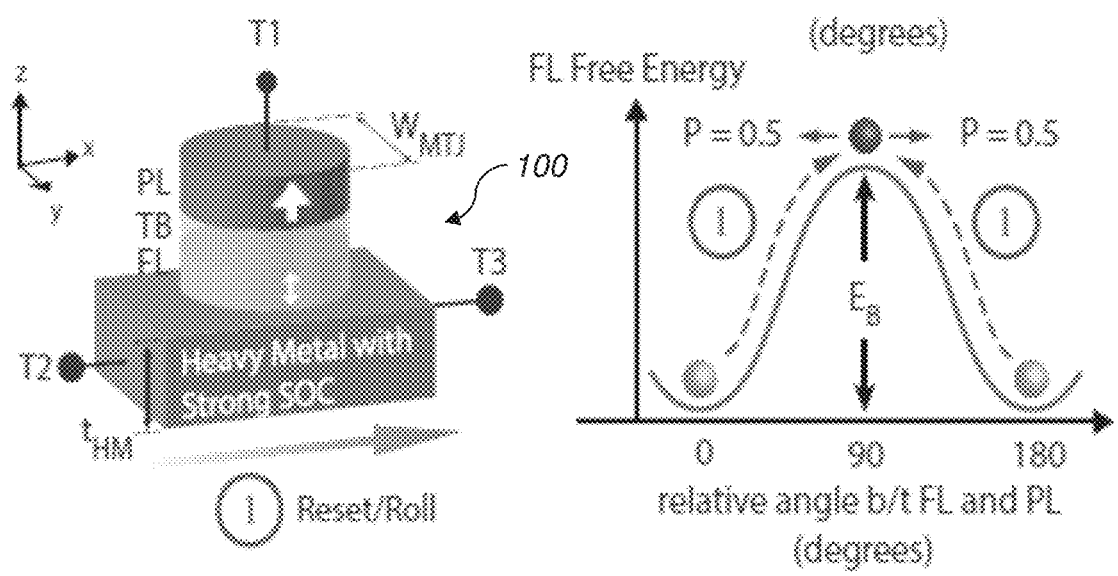
FIG. 8b illustrates a random number generator implementation in a second state using the device of FIG. 1 according to various aspects.

In certain embodiments, the device 100 may be implemented as part of a random number generator as shown in FIGS. 8a and 8b. In such a case, the device 100 is operated with the switching scheme described above, except only the first step of the switching scheme is performed (i.e., the charge current is supplied through the heavy metal layer 102 to place the magnetization of the free layer 104 in the direction of the hard axis in the "unstable region" of position 2 in FIG. 8a). Instead of then applying the second "write" current, the current through the heavy metal layer is simply turned off, allowing the random thermal field to tilt the magnetization of the free layer 104 closer to one of the two stable orientations as shown in FIG. 8b. This results in the device 100 acting as a truly random number (TRN) generator.

Figure 9A:
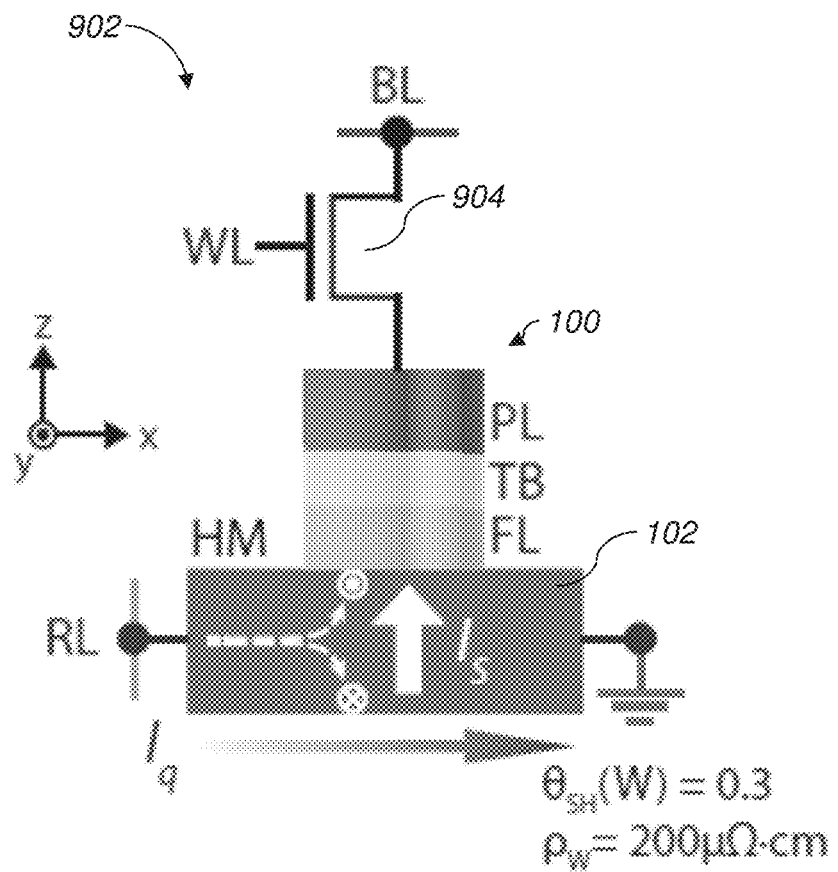
FIG. 9a illustrates a bit cell having a random number generator which incorporates the device of FIG. 1 according to various aspects.
Figure 9B:
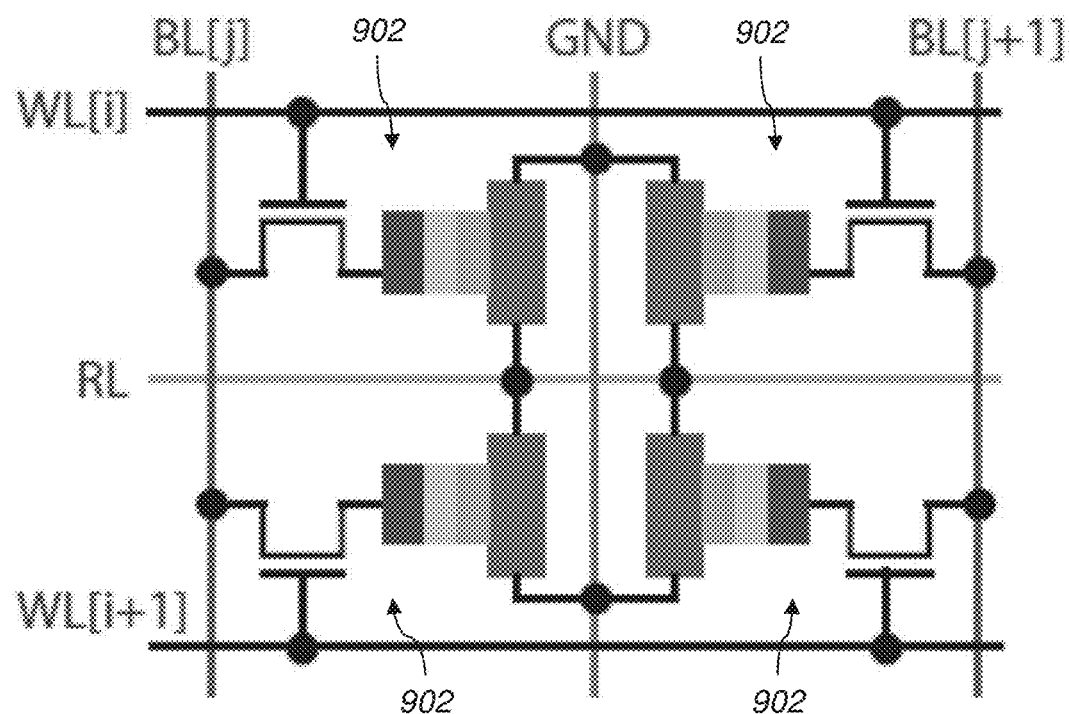
Figure 9C:
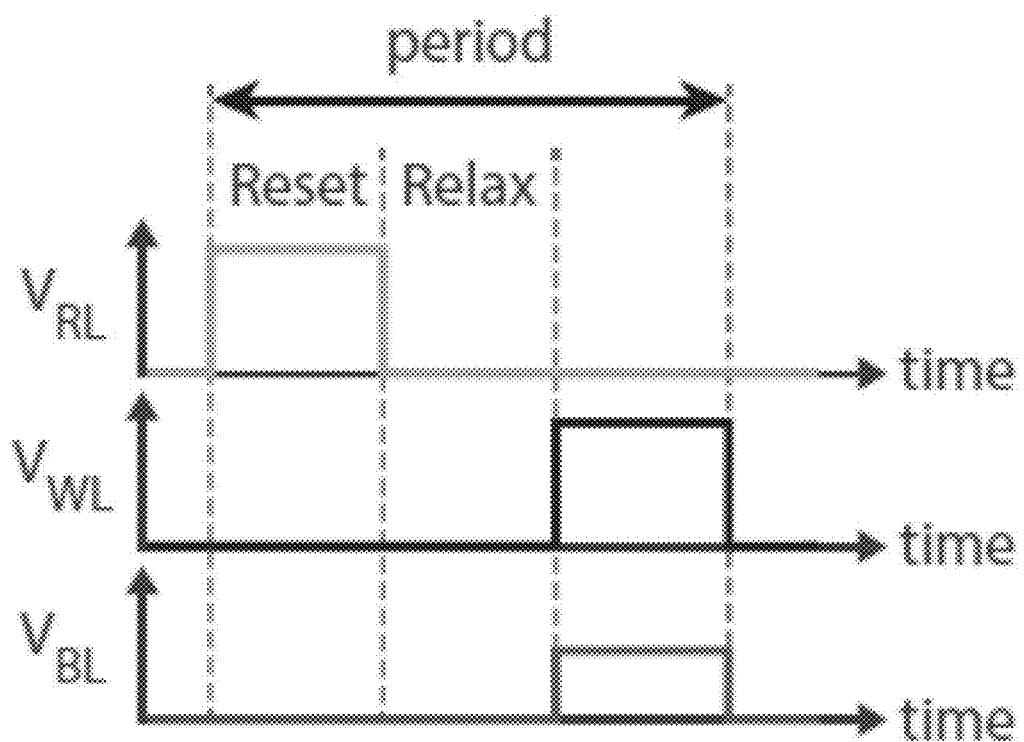
Figure 9D:
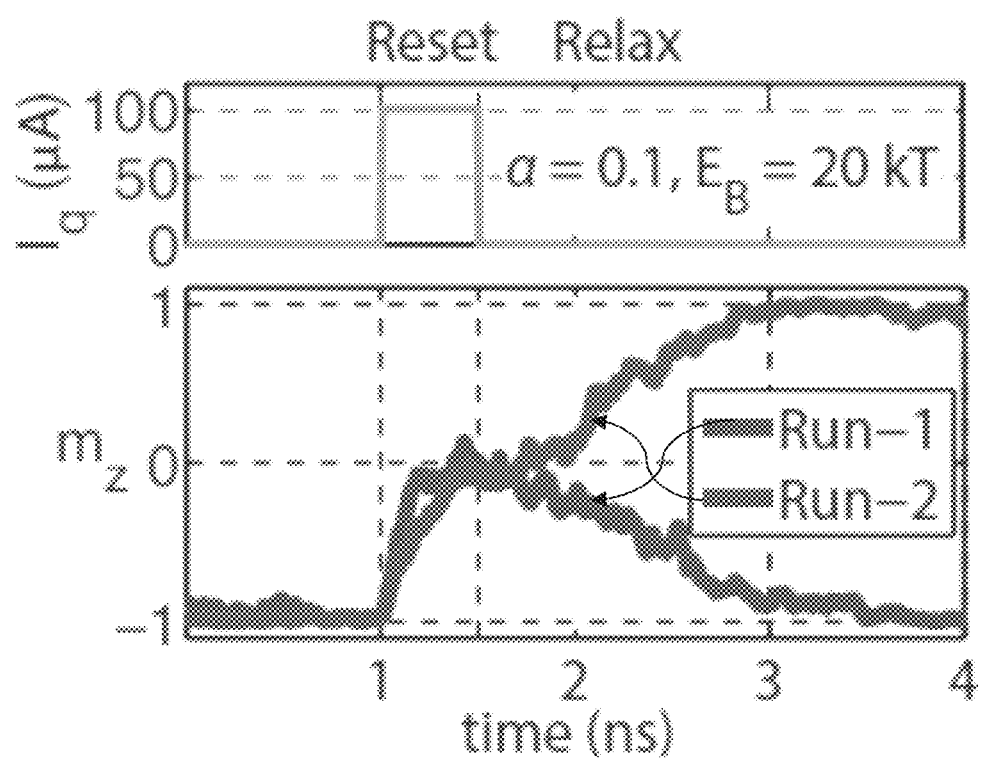

FIG. 9a shows a spin dice (SD) bit cell 902 which includes the threshold device 100 in combination with a single access transistor 904 to provide a TRN generator. As shown, the control input (e.g, the gate) of the transistor 904 is connected to a word line (WL) from a memory array and the switching terminals of the transistor 904 (e.g., source and drain) are connected between a bit line (BL) of the memory array and the pinned layer of the MTJ as shown. FIG. 9b shows a further embodiment of an array of multiple bit cells 902 where the rows sharing a Reset-Line (RL) can be driven together simultaneously. Hence, random numbers (RNs) are generated simultaneously in the entire array and each row can be read at a time by asserting a particular word-line (WL) and sensing the bit-line (BL). FIGS. 9c and 9d show the spin dice and the simulated waveform of free layer magnetization, respectively.

Various aspects described herein may be embodied as systems or methods. Accordingly, various aspects herein may take the form of an entirely hardware aspect, an entirely software aspect (including firmware, resident software, micro-code, etc.), or an aspect combining software and hardware aspects These aspects can all generally be referred to herein as a "service," "circuit," "circuitry," "module," or "system."

The invention is inclusive of combinations of the aspects described herein. References to "a particular aspect" and the like refer to features that are present in at least one aspect of the invention. Separate references to "an aspect" (or "embodiment") or "particular aspects" or the like do not necessarily refer to the same aspect or aspects; however, such aspects are not mutually exclusive, unless so indicated or as are readily apparent to one of skill in the art. The use of singular or plural in referring to "method" or "methods" and the like is not limiting. The word "or" is used in this disclosure in a non-exclusive sense, unless otherwise explicitly noted.

The invention has been described in detail with particular reference to certain preferred aspects thereof, but it will be understood that variations, combinations, and modifications can be effected by a person of ordinary skill in the art within the spirit and scope of the invention.

The invention claimed is:

1. An artificial neural network arrangement, comprising:
   a) a plurality of electrically conductive row crossbars, each row crossbar connect to a first terminal of a plurality of resistive memory elements;
   b) a plurality of electrically conductive column crossbars, each column crossbar connected to a second terminal of a plurality of resistive memory elements;
   c) a plurality of thresholding devices, the thresholding devices respectively connected to the conductive column crossbars and not the conductive row crossbars, each of the thresholding devices comprising:
      i) a heavy metal layer having a high spin orbit coupling;
      ii) a perpendicular magnetic anisotropy free layer having a bottom surface in contact with a top surface of the heavy metal layer;
      iii) a perpendicular magnetic anisotropy pinned layer;
      iv) an oxide tunnel barrier connected between the free layer and the pinned layer, wherein the pinned layer, the oxide tunnel barrier, and the free layer form a magnetic tunnel junction, wherein the pinned layer is connected to a corresponding one of the column crossbars.

2. The neural network arrangement according to claim 1, further comprising:
   a) a plurality of electronic switching devices each connecting the row crossbars to a voltage source.

3. The neural network arrangement according to claim 2, wherein each of the electronic switching devices comprises a control input, and wherein each control input is connected to an input signal.

4. The neural network arrangement according to claim 3, wherein each input signal is connected to the control inputs of a pair of the electronic switching devices; and wherein one of said pair of electronic switching devices is connected to a positive voltage source and the other one of said pair of electronic switching devices is connected to a negative voltage source.

5. The neural network arrangement according to claim 4, wherein the electronic switching devices comprise a transistor.

6. The neural network arrangement according to claim 1, wherein resistive memory elements comprise GeSbTe memristors.

7. The neural network arrangement according to claim 1, wherein the resistive memory elements comprise Ag—Se memristors.

* * * * *